United States Patent [19]

Matsui et al.

[11] Patent Number: 4,696,877
[45] Date of Patent: Sep. 29, 1987

[54] PHOTO-MASK BLANK COMPRISING A SHADING LAYER HAVING A VARIABLE ETCH RATE

[75] Inventors: Shigekazu Matsui; Kenichi Kägaya; Masao Ushida; Kouichi Maruyama, all of Tokyo, Japan

[73] Assignee: Hoya Corporation, Tokyo, Japan

[21] Appl. No.: 816,213

[22] Filed: Jan. 6, 1986

Related U.S. Application Data

[62] Division of Ser. No. 552,156, Nov. 15, 1983, Pat. No. 4,563,407.

[30] Foreign Application Priority Data

Nov. 16, 1982 [JP] Japan ............................ 57-199786
Nov. 16, 1982 [JP] Japan ............................ 57-199787

[51] Int. Cl.$^4$ ................................................ G03F 9/00
[52] U.S. Cl. .................................... 430/5; 156/628; 156/644
[58] Field of Search ................... 430/5; 428/664, 666; 156/664, 628

[56] References Cited

U.S. PATENT DOCUMENTS 4,497,878  2/1985  Hatano et al. ............... 428/698
4,530,891  7/1985  Nagarekawa et al. ........ 430/5

Primary Examiner—John E. Kittle
Assistant Examiner—José G. Dees
Attorney, Agent, or Firm—Roberts, Spiecens & Cohen

[57] ABSTRACT

In a photo-mask blank comprising a transparent substrate member and a shading layer of chromium covered on a principal surface of the substrate member, the shading layer has a first portion adjacent the principal surface and etched at a first etch rate and a second portion farther from the principal surface than the first portion and etched at a second etch rate lower than the first etch rate. For this purpose, nitrogen is dispersed so that the first portion becomes rich in nitrogen as compared with the second portion. Alternatively, carbon is dispersed so that the first portion becomes scarce in carbon relative to the second portion. The first portion may include nitrogen. The substrate member may comprise a transparent flat plate and a transparent conductive layer coated on the flat plate. The photo-mask blank is processed into a photo-mask through an etching process.

6 Claims, 11 Drawing Figures

PHOTO-MASK BLANK COMPRISING A SHADING LAYER HAVING A VARIABLE ETCH RATE

This is a division of application Ser. No. 552,156 filed 11/15/83, now U.S. Pat. No. 4,563,407.

BACKGROUND OF THE INVENTION

This invention relates to a photo-mask blank for use in manufacturing a semiconductor device, an integrated circuit, a large-scale integrated circuit, and the like and to a photo-mask made from the photo-mask blank.

A conventional photo-mask blank of the type described comprises a transparent substrate member having a principal surface and a shading layer of chromium (hereafter frequently referred to as a chromium layer) coated on the principal surface. The transparent substrate member may comprise a transparent plate and a transparent conductive layer attached to the transparent plate. The transparent plate may be a soda-lime glass, borosilicate glass, silica glass, or sapphire while the transparent conductive layer is made of indium oxide, tin oxide, or the like. The shading or chromium layer is frequently covered with an antireflection layer. The chromium layer and the chromium oxide layer are formed by sputtering, ion plating, or the like.

At any rate, the chromium layer is selectively etched by an etchant with a photoresist covered on the photo-mask blank, so as to leave a predetermined pattern of the chromium on the principal surface.

It should be noted here that objectionable dust is inevitably attached to the photoresist when the photoresist is made to adhere to the photo-mask blank by coating and baking the photoresist on the photo-mask blank. Such objectionable dust can be eliminated together with the photoresist on removal of the photoresist. However, the dust unpleasingly gives rise to undesired spots of chromium on the substrate member after exposure of the photoresist. This is because the photoresist is not exposed at the portions to which the dust is attached. The spots become serious when a fine pattern is delineated as the predetermined pattern.

The spots may be removed by carrying out excessive etching or overetching because they are very small. However, the excessive etching adversely affects the predetermined pattern and makes it difficult to delineate a precise pattern.

SUMMARY OF THE INVENTION

It is an object of this invention to provide a photo-mask blank which is capable of delineating a fine pattern.

It is another object of this invention to provide a photo-mask blank of the type described, wherein undesired spots of chromium can be reduced when the photo-mask blank is etched into a photo-mask.

It is a further object of this invention to provide a photo-mask blank of the type described, wherein the undesired spots can rapidly be etched off.

It is a yet further object of this invention to provide a photo-mask which is substantially free from the undesired spots.

A photo-mask blank to which this invention is applicable is for use in a lithograp technique. The photo-mask blank comprises a transparent substrate member having a principal surface and a shading layer of chromium having a first surface brought into contact with the principal surface and a second surface opposite the first surface. The shading layer comprises a first portion which is adjacent the first surface and which provides the first surface and a first etch rate and a second portion which is farther from the first surface than the first portion and which provides the second surface and a second etch rate lower than the first etch rate.

DESCRIPTION OF THE PREFERRED EMBODIMENTS

Figure 1A:
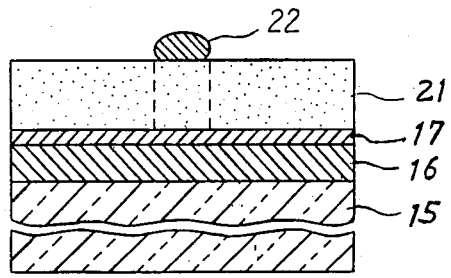
FIGS. 1a–1c show a sectional view for use in describing a method of processing a conventional photo-mask blank into a photo-mask.

Referring to FIG. 1, a method of processing a conventional photo-mask blank 10 into a photo-mask 11 will at first be described for a better understanding of this invention. In FIG. 1(a), the illustrated photo-mask blank 10 comprises a transparent substrate member 15 having a principal surface directed upwards, a chromium layer or a chromium lamina 16 on the principal surface, and a chromium oxide layer 17 on the chromium layer 16. The transparent substrate member 15 may either a transparent plate or a combination of a transparent plate and a transparent conductive layer attached to the transparent plate. The transparent plate may be of soda-lime glass, borosilicate glass, silica glass, or sapphire while the transparent conductive layer, indium oxide, tin oxide, or the like. The chromium lamina 16 has a first surface in contact with the principal surface and a second surface opposite the first surface and brought into contact with the chromium oxide layer 17. The chromium layer 16 and the chromium oxide layer 17 serve as a shading layer and an antireflection layer, respectively.

The chromium layer 16 is deposited to a thickness of 650 angstroms under a pressure of $10^{-3}$ Torr in an argon atmosphere by the use of a d.c. sputtering apparatus of a planar magnetron type. The sputtering apparatus is adjusted so that the chromium layer 16 has an optical density of 3.0. Nitrogen may be dispersed in the chromium layer 16 by carrying out sputtering in a mixed gas of argon and nitrogen. The etch rate of the chromium layer 16 is invariable.

The chromium oxide layer 17 is deposited on the chromium layer 16 to a thickness of 250 angstroms under a pressure of about $1 \times 10^{-4}$ Torr in an oxygen atmosphere by the use of the same sputtering apparatus. The illustrated photo-mask blank has a low reflectivity because of presence of the antireflection layer and may therefore be called a low reflection photo-mask blank. Nitrogen may be included in the chromium oxide layer 17.

As shown in FIG. 1(a), the photo-mask blank is covered with a photoresist 21 which may be AZ-1350 manufactured and sold by Shipley Far East Ltd., Tokyo, Japan. The photoresist 21 is subjected to a heat treatment so as to increase adhesion of the photoresist 21 and to vaporize a solvent included in the photoresist 21.

During the heat treatment, dust can adhere to the photoresist 21, as depicted at 22 in FIG. 1(a), because such heat treatment is generally carried out in a comparatively dusty atmosphere of, for example, Class 100. Such dust particles are 1 micron or so in size.

Under the circumstances the photoresist 21 is subjected to exposure, development, and selective removal. On selective removal of the photoresist 21, the dust 22 itself is removed together with the photoresist 21 but a portion of the photoresist 21 which underlies the dust 22 undesiredly remains on the photo-mask blank 10, as depicted at 25 in FIG. 1(b), in addition to a desired or a predetermined photoresist pattern (not shown) because such a portion is not subjected to the exposure.

Figure 1B:
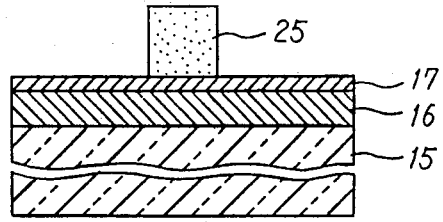
Figure 1C:
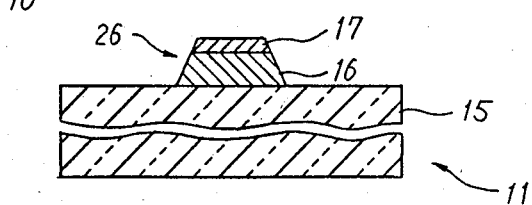

Subsequently, the photo-mask blank 10 illustrated in FIG. 1(b) is immersed into an etchant to selectively etch the chromium layer 16 and the chromium oxide layer 17. The etchant is formed by adding distilled water to 165 grams of ceric ammonium nitrate and 42 milliliters of perchloric acid (70%) and kept at a temperature between 19° C. and 20° C. The etching lasts a 50 seconds and, thereafter, the remaining photoresist 25 is eliminated in a known manner. Thus, the photo-mask 11 is manufactured with an undesired spot 26 left on the substrate member 15, as shown in FIG. 1(c), together with a desired pattern (not shown). It is readily understood that the undesired spot 26 results from the dust 22 illustrated in FIG. 1(a) and comprises the chromium layer 16 and the chromium oxide layer 17. The number of such undesired spots should be reduced to a minimum number in order to delineate a fine pattern. As known in the art, the number of undesired spots is specified by an average number of undesired spots per unit area (1 cm$^2$), which will be simply called a spot number.

The above-mentioned etching isotropically makes progress and, as a result, the undesired spot 26 gradually becomes wide as it comes near the principal surface. In other words, the undesired spot 26 has a maximum width in contact with the principal surface, as illustrated in FIG. 1(c). This is true of the desired pattern as long as the isotropical etching is carried out.

Figure 2:
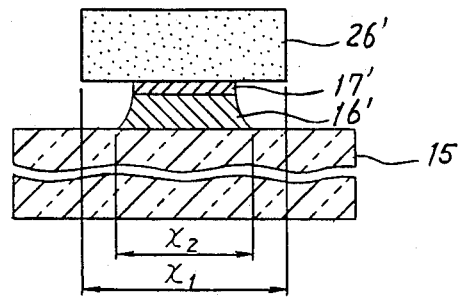
FIG. 2 shows a sectional view for use in describing in detail an etching process of the method illustrated in FIG. 1.

Referring to FIG. 2, chromium layer 16' and a chromium oxide layer 17' are etched with a photoresist 26' attached to the chromium oxide layer 17'. When etching is advanced to the principal surface the substrate member 15, both of the chromium layer 16' and the chromium oxide layer 17' are etched out. An etched-out time can be determined in consideration of the etching rate and the thickness of the chromium layer 16' and the chromium oxide layer 17'. When the ethcing is continued after the etched-out time, an undercut inevitably occurs under the photoresist 26', as shown in FIG. 2. The etching after the etched-out time may be referred to as overetching. Such an undercut can be specified by a width $x_1$ of the photoresist 26' and a maximum width $x_2$ of the chromium layer 16' measured along the principal surface. More specifically, the undercut is defined by a difference between the width $x_1$ of the photoresist 26' and the maximum width $x_2$ of the chromium layer 16'.

In FIG. 1, assume the overetching is carried out with the photoresist 25 coated on the chromium oxide layer 17. In this event, the undesired spot 26 gradually becomes small with an increase of the undercut. Finally, the undesired spot 26 can be removed from the principal surface by the overetching. However, such removal of the undesired spot 26 is time-consuming. For example, the time necessary for reducing the spot number to 0.1 (number/cm$_2$) is twice as long as the etched-out time. In addition, such long overetching makes it difficult to delineate a fine pattern, as described in the Background section of the instant specification.

Figure 3:
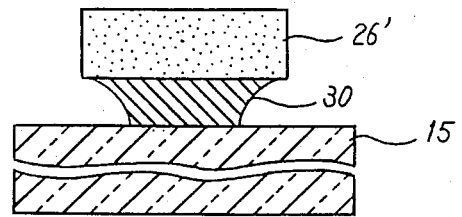
FIG. 3 shows a similar view for use in describing a principle of this invention.

Referring to FIG. 3, description will be made regarding the principle of this invention. In FIG. 3, a lamina 30 is coated on the principal surface of the substrate member 15 and is etched with a photoresist 26' attached to the lamina 30 so that the lamina 30 becomes narrower in width at a lower principal surface near the portion than at an upper portion remote from the principal surface. In other words, the lamina 30 may quickly be etched at the lower portion as compared with the upper portion. When such a lamina 30 is coated on the principal surface, an undesired spot is quickly removed from the substrate member 15 as a result of an undercut.

In order to realize such an etch rate, consideration is directed to a composition of the lamina 30.

Figure 4A:
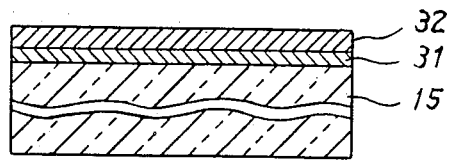
FIGS. 4a, 4b show sectional view for use in describing a photo-mask blank according to each of first and second embodiments of this invention.
Figure 4B:
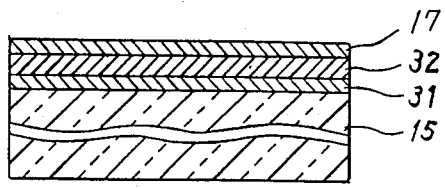

Referring to FIG. 4, a photo-mask blank according to a first embodiment of this invention comprises a transparent substrate 15 similar to that illustrated in conjunction with FIG. 1. In FIG. 4(a), the illustrated lamina 30 comprises a first chromium layer 31 brought into contact with the principal surface of the substrate member 15 and a second chromium layer 32 on the first chromium layer 31. The first and the second chromium layers 31 and 32 may be referred to as first and second portions, respectively. A combination of the first and the second chromium layers 31 and 32 is operable as a shading layer. The first and the second chromium layers 31 and 32 provide first and second surfaces brought into contact with the principal surface and the chromium oxide layer, respectively. The first and the second chromium layers 31 and 32 respectively have a first etch rate and a second etch rate lower than the first etch rate. To this end, the first and the second chromium layers 31 and 32 are deposited in a mixed gas of nitrogen and argon by the use of a d.c. sputtering device of a planar magnetron type.

Figure 5:
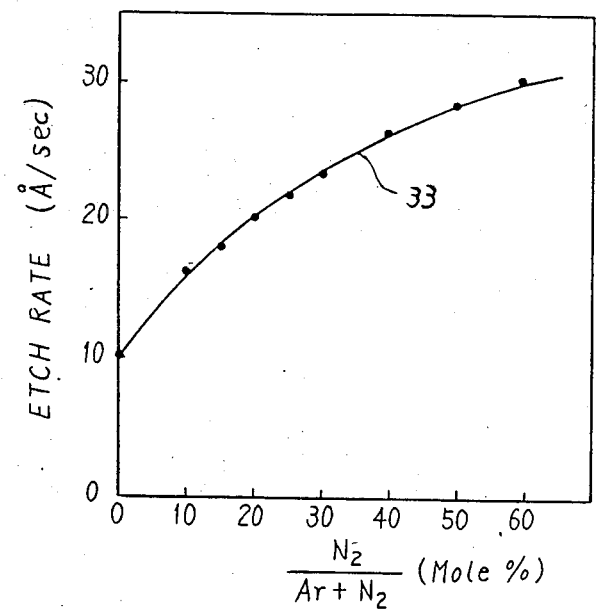
FIG. 5 shows a graph for use in describing a relationship between a nitrogen atmosphere and an etch rate.

Temporarily referring to FIG. 5, curve 33 shows a relationship between a mixed ratio (mole percent) of nitrogen included in the mixed gas and an etch rate (angstroms/second) of a chromium layer. Use is made of an etchant similar to that described in conjunction with FIG. 1(b). It is readily understood from the curve 33 that the etch rate of the chromium layer is raised with an increase of the mixed ratio of nitrogen. Inasmuch as the content of nitrogen increases in the chromium layer with an increase of the mixed ratio of nitrogen, it may be said that the etch rate of the chromium layer is dependent on the degree of nitrogenization of the chromium layer.

Taking the above into consideration, the first and the second chromium layers 31 and 32 are deposited in atmospheres different from each other.

Returning to FIG. 4, chromium oxide layer 17 is deposited as an antireflection layer on the second chromium layer 32 to a thickness of 250 angstroms. The chromium oxide layer 17 may include nitrogen. A combination of the first and the second chromium layers 31 and 32 and the chromium oxide layer 17 is etched in a manner similar to the lamina 30 illustrated in FIG. 3.

Table 1 shows Examples 1, 2, and 3 according to the first embodiment of this invention together with a conventional example. On manufacturing each example, the sputtering apparatus is adjusted so that an optical density becomes equal to 3.0. In each of Examples 1, 2, and 3, the first and the second chromium layers 31 and 32 are deposited to thicknesses of 150 and 500 angstroms, respectively, while the conventional example has a chromium layer of 650 angstroms thick.

TABLE 1

|  | 1st Cr layer (31) Ar:N$_2$ (Molar ratio) | 2nd Cr layer (32) Ar:N$_2$ (Molar ratio) |
| --- | --- | --- |
| Example 1 | 75:25 | 85:15 |
| Example 2 | 60:40 | 85:15 |
| Example 3 | 40:60 | 85:15 |
| Conventional Example | 85:15 | 85:15 |

In Examples 1 through 3, each first chromium layer 31 is etched at the first etch rate greater than 20 angstroms/second while etch second chromium layer 32, the second etch rate lower than 20 angstroms/second and higher than 18 angstroms/second, as shown in FIG. 5. In other words, the first chromium layer 31 is rich in nitrogen as compared with the second chromium layer 32. This means that the first chromium layer 31 is higher in the degree of nitrogenization than the second chromium layer 32. On the other hand, the chromium layer of the conventional example is etched at a uniform etch rate not higher than 18 angstroms/second.

Figure 6:
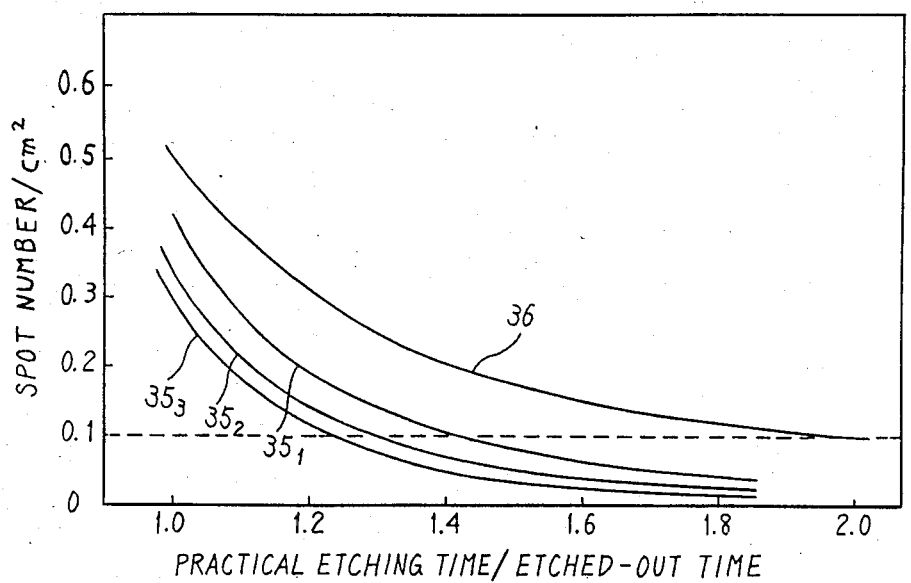
FIG. 6 shows a graph for use in describing characteristics of the photo-mask blank according to the first embodiment of this invention and the conventional photo-mask blank illustrated in FIG. 1.

Referring to FIG. 6, wherein the abscissa and the ordinate represent an etching time ratio of a practical etching time to an etched-out time and a spot number described in conjunction with FIG. 1(c), respectively, curves 35$_1$, 35$_2$, and 35$_3$ show characteristics of Examples 1, 2, and 3, respectively, while curve 36 shows the characteristic of the conventional example.

It is preferable that the spot number is not greater than 0.1/cm$^2$, as mentioned before. In order to reduce the spot number to 0.1/cm$^2$, the conventional example takes twice the etched-out time as shown by the curve 36 whereas the embodiments of the invention take, 1.4 times as long as the etched-out time at most, as readily understood from the curves 35$_1$ to 35$_3$. In addition, the reduction of the spot number becomes rapid in relation to the degree of the nitrogenization included in the first chromium layer 31. As a result, it is possible to make the etching time ratio approach unity. Accordingly, the combination of the different etch rates of the chromium layers serves as a means for rapidly reducing the number of undesired spots of the chromium layers remaining on the substrate by undercutting as a result of etching.

The degree of nitrogenization may continuously be varied within the first and the second chromium layers 31 and 32 so that the etch rate is gradually and continuously reduced as a distance from the principal surface increases.

Figure 7:
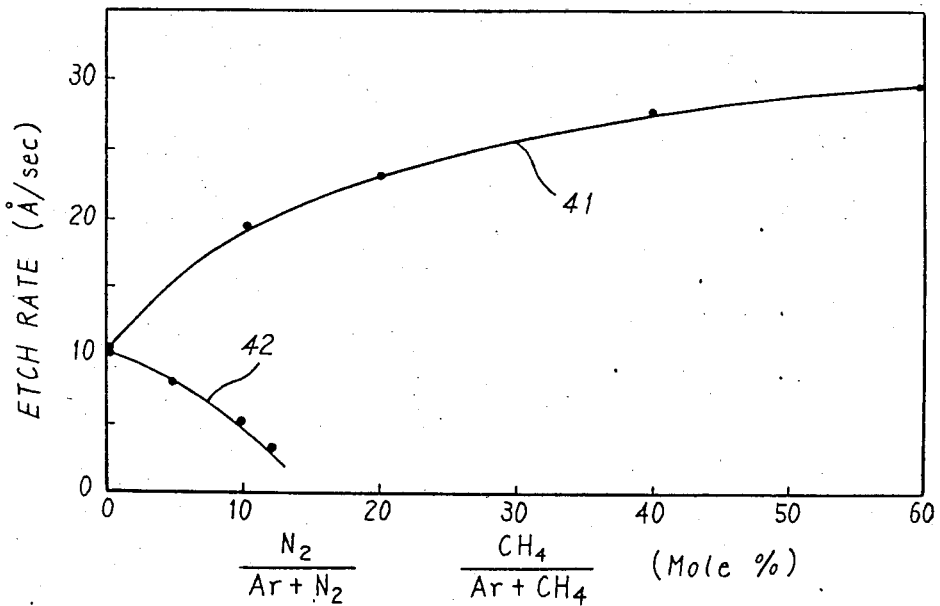
FIG. 7 shows a graph for use in describing a relationship between a carbon atmosphere and an etch rate.

Referring to FIG. 4 again and also to FIG. 7, a photomask blank according to a second embodiment of this invention comprises a first chromium layer 31 deposited to a thickness of 150 angstroms in a first mixed gas of argon and nitrogen and a second chromium layer 32 deposited to a thickness of 500 angstroms in a second mixed gas of argon and methane ($CH_4$). The first and the second chromium layers 31 and 32 therefore include nitrogen and carbon, respectively. The contents of nitrogen and carbon included in the first and the second chromium layers 31 and 32 are specified by a degree of nitrogenization and a degree of carbonization, respectively. Thereafter, a chromium oxide layer 17 is deposited to a thickness of 250 angstroms on the second chromium layer 32 in a known manner. The chromium oxide layer 17 serves as an antireflection layer. Nitrogen may be included in the chromium oxide layer 17 by carrying out sputtering in an atmosphere of, for example, argon and nitrogen monoxide. A combination of the first and the second chromium layers 31 and 32 and the chromium oxide layer can be etched in a similar manner to the lamina 30 illustrated in FIG. 3.

In FIG. 7, a first curve 41 shows a relationship between a first mixed ratio (mole percent) of nitrogen included in the first mixed gas and a first etch rate of chromium layer including the nitrogen. The first curve 41 is similar to the curve 33 illustrated in FIG. 5 and therefore manifests that the etch rate is raised with an increase of the nitrogen included in the mixed gas. A second curve 42 shows the relationship between a second mixed ratio of methane included in the second mixed gas and a second etch rate of a chromium layer including the carbon. The second etch rate decreases with an increase of the second mixed ratio and is less than 5 angstroms/second when the second mixed ratio exceeds 10%.

Table 2 shows Examples 4, 5, and 6 according to the second embodiment of this invention. In carrying Examples 4, 5, and 6, the sputtering apparatus is adjusted so that optical density becomes equal to 3.0 in each shading layer comprising the first and the second chromium layers 31 and 32.

TABLE 2

|  | 1st Cr layer (31) Ar:N$_2$ (Molar ratio) | 2nd Cr layer (32) Ar:CH$_4$ (Molar ratio) |
| --- | --- | --- |
| Example 4 | 80:20 | 88:12 |
| Example 5 | 60:40 | 88:12 |
| Example 6 | 40:60 | 88:12 |

It is readily seen from Table 2 and FIG. 7 that each first chromium layer 31 of Examples 4 to 6 is etched at an etch rate greater than 20 angstroms/second while each second chromium layer 32 thereof is etched at an etch rate less than 5 angstroms/second. Consequently, there is achieved a ratio of the etch rate of the first layer to that of the second layer of at least 4. At any rate, the shading layer is slowly etched at a portion remote from the principal surface and is quickly etched at another portion adjacent to the principal surface.

Figure 8:
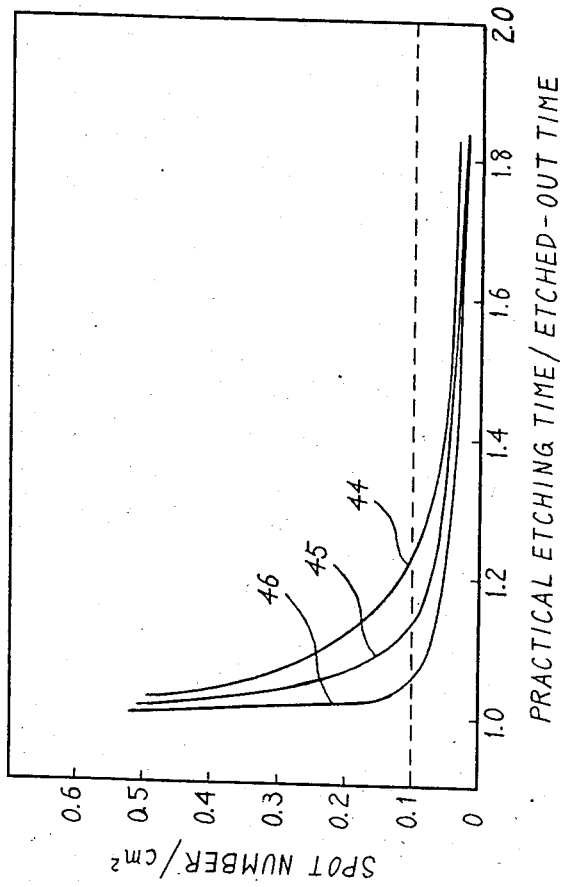
FIG. 8 shows a graph for use in describing characteristics of the photo-mask blank according to the second embodiment of this invention.

Referring to FIG. 8, wherein the abscissa and the ordinate represent an etching time ratio of practical etching time to etched-out time and a spot number undesirably remaining on the substrate member 15, respectively, curves 44, 45, and 46 show characteristics of Examples 4, 5, and 6, respectively. It is seen from curves 44, 45, and 46 that the spot number can be reduced to 0.1/cm$^2$ before the etching times ratio becomes 1.4 time the etched-out time. Thus, the undesired spot as illustrated in FIG. 1(c) can quickly be eliminated from the principal surface. In addition, the practical etching time becomes short with an increase of the nitrogen included in each first chromium layer 31 and approaches the etched-out time.

While this invention has thus far been described in conjunction with a few embodiments thereof, it will readily be possible for those skilled in the art to put this invention into practive in various manners. For example, the antireflection layer 17 may not always be attached to the shading layer. Carbon along may be distributed to the chromium layer so that the etch rate of the chromium layer becomes low as the distance from the principal surface increases. In this event, the second chromium layer 32 is rich in carbon as compared with the first chromium layer 31. In other words, the second chromium layer 32 is higher in the degree of carbonization than the first chromium layer 31. Instead of sputtering, vapor deposition, ion-plating, or the like may be used to deposit the shading and the antireflection layers.

What is claimed is:

1. A photo-mask blank for use in a lithography technique, comprising a transparent substrate member having a principal surface and a shading layer of chromium having a first surface in contact with said principal surface and a second surface opposite said first surface, said shading layer comprising:
   a first portion which is adjacent said principal surface and which provides said first surface, said first portion having a first etch rate; and
   a second portion which is farther from said first surface than said first portion and which provides said second surface, said second portion having a second etch rate lower than first etch rate to provide in combination therewith a means for rapidly reducing undesired spots of the chromium layer remaining on the substrate to a number which is not greater than $0.1/cm^2$ wherein the difference in etch time between the first and second portions is sufficiently great to effect reduction in a time period which is not more than 1.4 times greater than the time period for producing etching without undercutting.

2. A photo-mask blank as claimed in claim 1 wherein said difference in etch time between the first and second portions is so great that the ratio of the increase in the time period of etching approaches unity.

3. A photo-mask blank as claimed in claim 1 wherein the ratio of etch time of the seond layer to that of the first layer is at least 4.

4. A photo-mask for use in lithography technique, comprising a transparent substrate member having a principal surface and a patterned shading layer of chromium having a first surface in contact with said principal surface and a second surface opposite said first surface, said patterned shading layer comprising:
   a first portion which is adjacent said principal surface and which provides said first surface, said first portion having a first etch rate; and
   a second portion which is farther from said first surface than said first portion and which provides said second surface, said second portion having a second etch rate lower than said first etch rate to provide in combination therewith a means for rapidly reducing undesired spots of the chromium layer remaining on the substrate to a number which is not greater than $0.1/cm^2$ wherein the difference in etch time between the first and second portions is sufficiently great to effect reduction in a time period which is not more than 1.4 time greater than the time period for producing etching without undercutting.

5. A photo-mask as claimed in claim 4 wherein said difference in etch time between the first and second portions is so great that the ratio of the increase in the time period of etching approaches unity.

6. A photo-mask as claimed in claim 2 wherein the ratio of etch time of the second layer to that of the first layer is at least 4.

* * * * *